United States Patent [19]

Esker et al.

[11] Patent Number: 5,396,197
[45] Date of Patent: Mar. 7, 1995

[54] NETWORK NODE TRAP

[75] Inventors: Lawrence W. Esker; Fred P. Rhine, both of Washtenaw County, Mich.

[73] Assignee: Allen-Bradley Company, Inc., Milwaukee, Wis.

[21] Appl. No.: 265,056

[22] Filed: Jun. 24, 1994

Related U.S. Application Data

[63] Continuation of Ser. No. 56,445, May 3, 1993, abandoned.

[51] Int. Cl.$^6$ ............................................. H03H 7/38
[52] U.S. Cl. ..................................... 333/131; 333/170
[58] Field of Search ............... 333/100, 131, 170, 171; 455/73; 373/36

[56] References Cited

U.S. PATENT DOCUMENTS

| | | | |
|---|---|---|---|
| 4,319,338 | 3/1982 | Grudowski et al. | 364/900 |
| 4,667,227 | 5/1987 | Ikeda | 358/75 |
| 4,747,100 | 5/1988 | Roach et al. | 370/86 |
| 4,885,562 | 12/1989 | Ouvrard et al. | 333/139 |
| 4,902,989 | 2/1990 | Glaab | 333/100 |
| 4,973,926 | 11/1990 | Yu | 333/112 |
| 5,073,762 | 12/1991 | Yu | 333/112 |

OTHER PUBLICATIONS

"The Constant-K Band-pass and Band-stop Filters" *The Theory of Networks in Electrical Communication* by F. E. Rogers MacDonald Publishers London 1957 pp. 442–445.

*Primary Examiner*—Robert J. Pascal
*Assistant Examiner*—Darius Gambino
*Attorney, Agent, or Firm*—Keith M. Baxter; John J. Horn; H. F. Hamann

[57] ABSTRACT

A transformer-coupled, bridged-T network for connection of a load to an electrical communication network includes a transformer with a center tap and two end taps, a drop cable for electrical connection of the load to the center tap and passive elements connected across the transformer to compensate for impedance of the drop cable and the load when the load is connected through the drop cable to the center tap

6 Claims, 2 Drawing Sheets

NETWORK NODE TRAP

This is a continuation of application Ser. No. 08/056,445, filed May 3, 1993, abandoned.

BACKGROUND OF THE INVENTION

1. Field of the Invention

The invention relates generally to data communication networks, and more particularly to T-type connectors for connecting a network trunk line to network node devices via drop lines.

2. Description of the Background Art

Two types of connectors known in the art are T-connectors and attenuating node taps. T-connectors have been used to connect network node devices to networks of the type described in U.S. Pat. No. 4,319,338; U.S. Pat. No. 4,667,227 and U.S. Pat. No. 4,747,100, and known in the trade as Data Highway TM Data Highway II TM and Data Highway Plus TM, respectively. Attenuating node taps are known for connecting node devices to carrier band networks specified under IEEE Standard 802.4.

The T-tap allows low cost node transceivers and low cost taps. However, due to the loading of the drop cable and node transceiver, signal reflections are set up on the network bus, thus distorting and attenuating network communication waveforms. To minimize signal reflections, very short drop cables are required (<1/10 carrier wavelength), and the number of nodes, the node spacing and the maximum network length is restricted.

The attenuating tap uses transformer and resistor elements to match the impedance of all three ports. The advantages of the attenuating tap are reduction in signal reflections and an ability to use longer drop cables. A disadvantage of the attenuating tap is large attenuation in the signals which are transmitted and received. Expensive, high power transmitters and sensitive receivers are required in the node electronics to overcome this signal attenuation. Sensitivity to noise induced on the network is increased. Another disadvantage with the attenuating tap is the "through loss" of the tap is relatively high, thereby restricting the number of nodes and maximum network length.

Another T-connector device is illustrated in Glaab, U.S. Pat. No. 4,902,989. In this design the inductance of the transformer compensates for the capacitance in the drop cable, but this is not the full compensation needed for a node tap circuit.

A general problem in use of the above described networks is leaving one or more taps in the network disconnected from their load transceivers. This typically changes the impedance of the tap which can cause signal reflections and the undesirable results discussed above.

SUMMARY OF THE INVENTION

The invention is incorporated in a passive tap circuit that uses simple elements to compensate for the load impedance of the drop cable and the transceiver, and also presents an acceptable impedance when the tap is left disconnected from a load.

The invention helps minimize reflection loss experienced with T-taps of the prior art. The invention minimizes reflection loss over a wide bandwidth of frequencies. The invention provides a tap with less "through loss" than the attenuating taps. The invention is usable with the low cost transceivers used with T-taps of the prior art.

The invention enables the network to be extended to greater length and permits more nodes to be connected to the network.

The invention provides low frequency noise filtering at each location on the network.

More specifically, the invention is embodied in a network tap circuit with two end .terminals for connection between two points in the electrical communication network, a transformer with a center tap and two end taps, the end taps being electrically connected to respective end terminals, a drop cable for electrical connection of a load to the center tap, elements connected across the transformer and between the two end terminals to compensate for the impedance of the drop cable and the load, when the load is connected through the drop cable to the center tap.

In a more particular aspect of the invention, compensating means includes an inductance connected in parallel with the transformer to compensate for the capacitance of the drop cable and the load, and a capacitance connected in parallel with the transformer to compensate for the series inductance of the drop cable and the load.

The passive tap circuit is designed so that impedance characteristics remain the same over as wide a bandwidth as possible. Reflection loss through the two network ports is minimized. Through loss through the two network ports is minimized by minimizing resistive elements. The two network ports are symmetrical. The node port need not be matched, because reflection loss is minimal due to the short length of the drop cable.

Other objects and advantages, besides those discussed above, will be apparent to those of ordinary skill in the art from the-description of the preferred embodiment which follows. In the description, reference is made to the accompanying drawings, which form a part hereof, and which illustrate examples of the invention. Such examples, however, are not exhaustive of the various embodiments of the invention, and, therefore, reference is made to the claims which follow the description for determining the scope of the invention.

DETAILED DESCRIPTION OF THE PREFERRED EMBODIMENT

Figure 1:
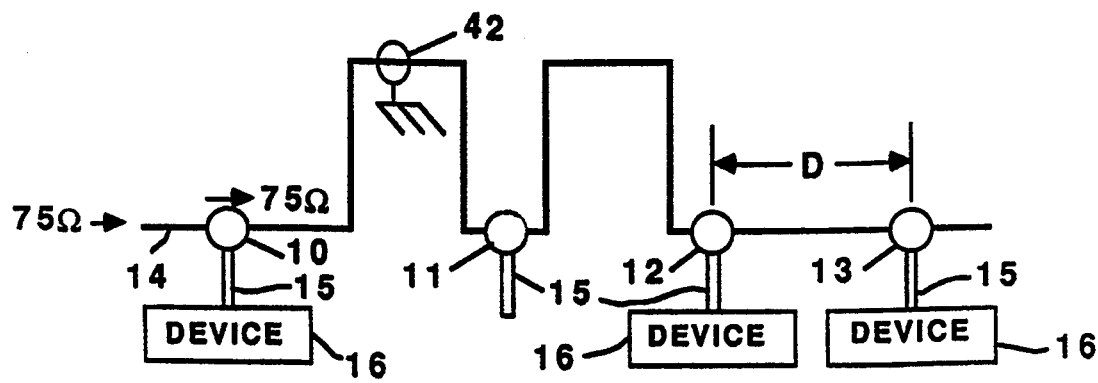
FIG. 1 is a schematic diagram of a network employing the circuit of the present invention.

Referring to FIG. 1, the invention is incorporated in each one of several passive tap circuits 10, 11, 12, 13, of like construction, which are connected in a trunk line 14 of a data communication network. Passive tap circuits 10, 12 and 13 are also connected through drop cables 15 to electrical devices 16. Passive tap circuit 11 and its associated drop cable 15 have been left unconnected from any device 16 to illustrate one feature of the invention.

The trunk line 14 is provided in the form of RG-6 coaxial cable, and is optionally connected to a single point system ground 42 at one location. The sheath on the coaxial trunk cable 14 is grounded, preferably at midpoint in the line 14, to minimize low frequency ground currents in the cable sheath.

Figure 3:
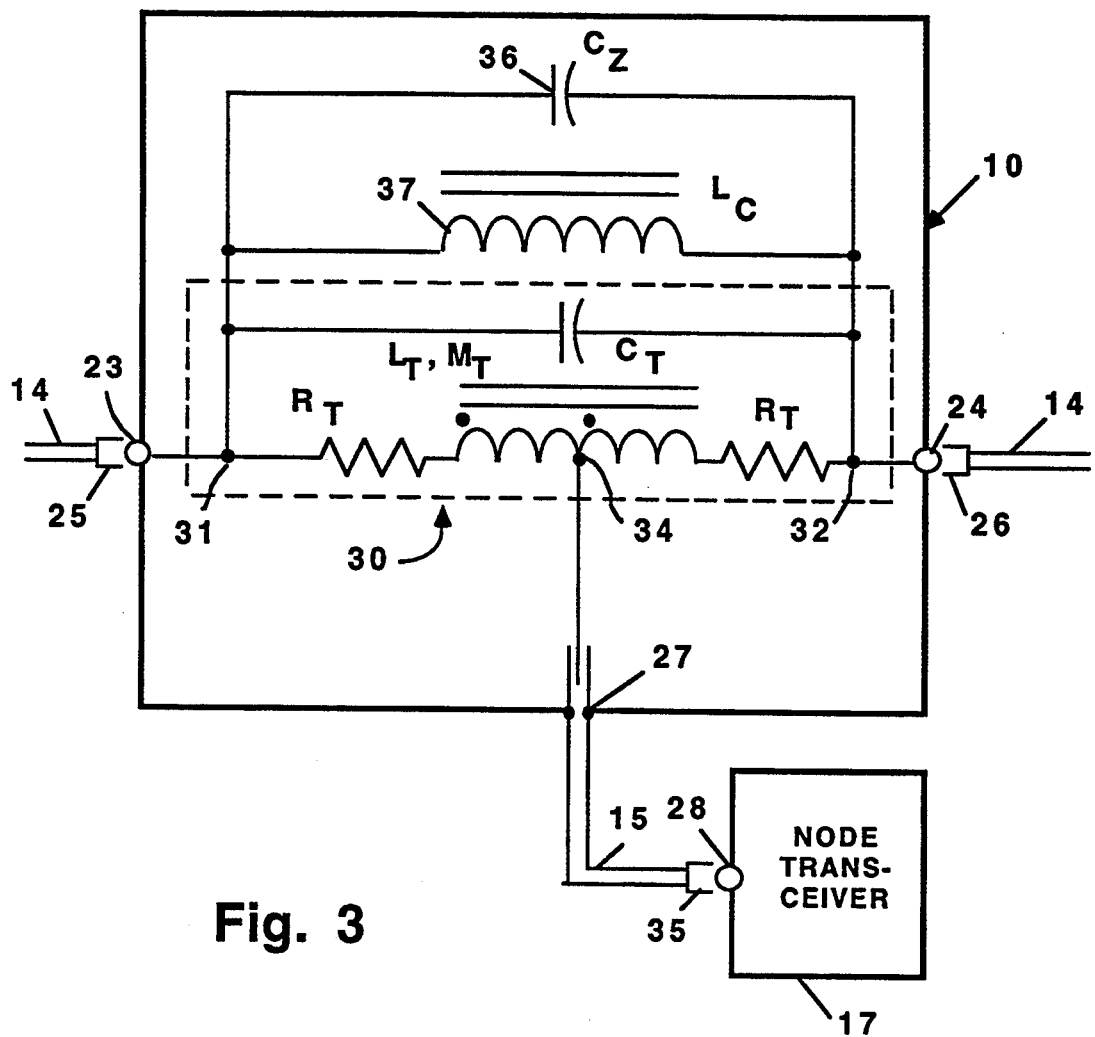
FIG. 3 is a schematic diagram of the circuit of the preferred embodiment.

The node devices 16 may be one of many types of electrical equipment used in the field of industrial control, but in each case they will include a node transceiver 17 (receiver plus transmitter) in FIG. 3 for communicating data over the network in the network signalling mode.

Figure 2:
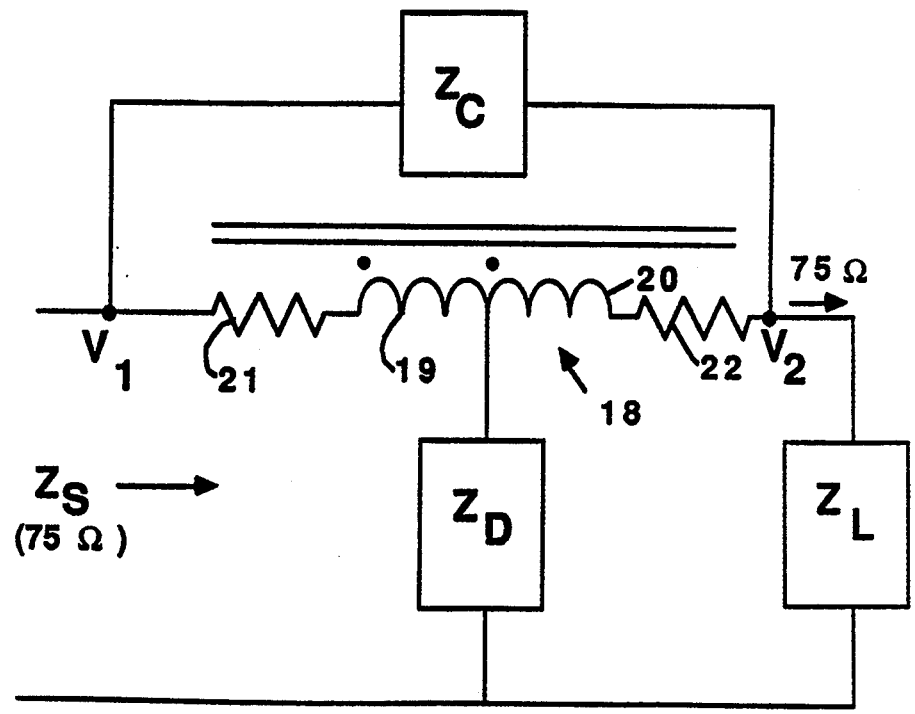
FIG. 2 is a schematic of theoretical diagram of the transformer-coupled, bridged-T network of the present invention.

As seen in FIG. 2, the node tap circuits 10, 12 and 13 each provide a characteristic load impedance ($Z_L$) of 75 ohms looking downstream from terminal $V_2$ as well as an input impedance of 75 ohms looking into terminal $V_1$.

The circuit of the invention, in general terms, is a transformer-coupled, bridged-T network. A transformer 18 is connected between end taps $V_1$ and $V_2$ and providing coupled mutual inductances 19, 20 and winding resistances 21, 22. It is anticipated that a load will be connected to the circuit representing node drop impedance ($Z_D$). In making the invention, the inventors discovered that, in this circuit, and assuming an ideal transformer, the characteristic load impedance ($Z_L$) of the network down the line from the tap circuit could be matched to the source impedance ($Z_S$) when the bridged impedance ($Z_C$) and the node drop impedance ($Z_D$) were related to the characteristic load impedance ($Z_L$) by the following equation:

$$Z_C = Z_L^2 / Z_D \quad (1)$$

The inventors then investigated, given the transformer and the characteristics of the load, what circuit elements should be included in impedances $Z_D$ and $Z_C$. The resulting circuit of the invention is seen in FIG. 3.

The passive tap circuit 10 has two end terminals 23, 24 which are BNC-type jacks for connection to plug ends 25, 26 of the network trunk line 14. The circuit 10 is also connected through a drop cable 15 to a node tap terminal 35, which is a right angle, BNC-type plug which provides strain relief for the drop cable 15. This terminal 35 plugs into a terminal 28 on a node transceiver 17. The drop cable 15 is a 1-meter length of RG-59 coaxial cable which is permanently connected and molded into the passive tap circuit 10 as it passes through its shielded enclosure at point 27. The length and impedance of the drop cable is related to the other impedance calculations, so that the preselected length must be maintained for the circuit component values described herein.

An autotransformer 30 is included with a large magnetizing inductance ($M_T$), a small leakage inductance ($L_T$) and small size. This is accomplished by using a high permeability core with a maximum number of non-overlapping turns. Physically the autotransformer 30 is specified as toroidal transformer with Ferronics (11-720B or 11-220B) core, eighteen turns bifiliar/single strand, with minimum overlap, 30AWG heavy polynylon magnet wire with 1-inch leads. The measured electrical specifications were:
 leakage inductance ($L_T$) = 75 nH (@0.3 Mhz)
 magnetizing inductance ($M_T$) = 890 uH (@0.3 Mhz)
 winding capacitance ($C_T$) = 20 pF (@25 MHz)
 winding resistance ($R_T$) = 0.1 Ohm (@0.3 Mhz)
 core loss resistance ($R_M$) = 16 kOhm (@1.3 Mhz)

The transformer 30 was selected so that the winding resistance $R_T$=0.1 Ohm was small. The effects of the core loss of the transformer ($R_M$) and the magnetizing inductance of the transformer ($M_T$) were considered negligible for purposes of the invention. The winding capacitance ($C_T$) is subtracted from the ideal compensation capacitor 36 ($C_Z$).

If a circuit is used to model the impedance of the drop cable 15 and node transceiver 17, then another circuit, referred to as a dual, can be arranged according to the following principles:

1) Series elements are replaced by parallel elements.
2) Inductors are replaced by capacitors; capacitors are replaced by inductors.
3) Each capacitance is multiplied by the square of the network's characteristic impedance ($R_L$) to calculate its corresponding inductance. Each inductance is divided by the square of the network's characteristic impedance ($R_L$) to calculate its corresponding capacitance. Each resistance is scaled to the square of the network's characteristic impedance ($R_L$) divided by its corresponding resistance.

Referring to FIG. 2, if $Z_L = R_L$ and $Z_C$ is equal to the dual of the elements comprising $Z_D$, then $Z_S$ will equal $R_L$. The dual of a transmission line is another transmission line of the same length with a characteristic impedance equal to the square of the network's characteristic impedance ($R_L$) divided by the original impedance of the transmission line. This means that the proper compensation of the drop cable must include another transmission line. As this is not practical, the drop cable must be electrically short to be modeled as discrete elements, in this case no more than 1/10 wavelength of the upper signalling bandwidth.

Using the principle of the dual circuit, compensating elements 37 ($L_C$) and 36 ($C_Z$) are provided, as seen in FIG. 3, to compensate for the capacitance and series inductance in the combination of the drop cable 15 and node transceiver 17. These compensating elements 37 ($L_C$) and 36 ($C_Z$) are connected in parallel across the windings of the transformer 30 to end taps 31, 32.

The compensating element 37 ($L_C$) compensates for the capacitance of the drop cable 15 and the node transceiver 17. The compensating element 36 ($C_Z$) compensates for an inductance ($L_S$), which is the sum of 1) the series inductance of the drop cable 15, 2) the leakage inductance of the autotransformer 30 ($L_T$) and 3) the series inductance of the coupling transformer in the node transceiver 17 (the load).

To make a passive network node tap according to the above principle, there are four steps. First, some basic measurements are made of a selected drop cable and a typical node transceiver (load). Then, theoretical calculations are made for the compensation elements of the circuit using equations 2) to 5) below. Next, a circuit, based on the actual measurements of the cable and load and the calculated compensation elements, is simulated using a computer program, Touchstone, commercially offered by EE Soft. The values of the compensation elements are adjusted to obtain a desired response in a bandwidth of interest and in response to conditions such as unconnected taps in a network. The resulting design is then constructed, tested and adjusted in the lab.

Using this method, impedance measurements are made of the drop cable 15, the transceiver 17 and the autotransformer 30. Next, the compensating elements $L_C$ and $C_Z$ are calculated as the dual of the impedance offered by the drop cable 15 and the node transceiver 17, and then scaled by the square of the resistance ($R_L$) of the trunk line 14, which is in accord with equation 1 above.

Mathematically, $L_C$ and $C_Z$ are expressed as follows:

$$C_Z = (L_S/R_L^2) - C_T \quad (2)$$

where $$L_S = L_T/2 + L_{CABLE} + L_{LOAD} \quad (3)$$

and $$L_C = R_L^2 (C_P) \quad (4)$$

where $$C_P = C_{CABLE} + C_{LOAD} \quad (5)$$

Using the desired resulting termination impedance ($R_L$) of the node tap circuit, 75 ohms, in equation 1) and measuring the series leakage inductance $L_S$ as 0.5 uH, an initial compensating capacitance $C_Z$ of 69 pF was calculated according to equation 2) above.

Again, using the desired resulting resistance ($R_L$) of the node tap circuit, 75 ohms, and equation 4), the compensating inductance $L_C$ was calculated as the measured cable and load capacitance (50+65 pF) multiplied by $R_L^2$, which resulted in a calculated $L_C$ of 0.65 uH.

Third, using these initial values a circuit as shown in FIG. 3 was modeled on a computer for a range of frequencies using the analog simulation program known as Touchstone. The compensating elements were adjusted to minimize reflection loss in the frequency range from 150 kHz to 20 MHz. An additional feature of the passive tap circuit 10 is it operates as a band pass filter in this frequency range. Any noise introduced into the cable at frequencies below 150 kHz is filtered out. It has been discovered that most noise exists at frequencies below 150 kHz. When optimized for minimum insertion loss and maximum bandwidth, the best performance was observed for values of $L_C = 0.56$ uH and $C_Z = 56$ pF.

When the network is in use, a load is not always connected to a tap. If the cable 15 is left unconnected, the most significant impedance factor CP is reduced by about 50%. The circuit 10 is optimized to handle a certain number of disconnections. With a passive tap circuit 10 as described herein, the network may extend to a length of 500 meters and handle 32 nodes. The maximum length of the network for 2 nodes is 1000 meters. The minimum spacing between nodes, illustrated as distance D in FIG. 1, approaches zero (two tap circuits 12, 13 may be adjacent to one another). This represents a two to three times improvement in distance and nodes over networks using T-connectors of the prior art and operating at a comparable data rate.

Although the above example has described the bridge impedance ($Z_c$), in Equation 1 and FIG. 2, as the compensating impedance for a predetermined tap impedance, $Z_D$, it is also possible to use $Z_D$, the tap impedance, as a compensating impedance for a known bridge impedance for $Z_c$, according to Equation 1. It should be understood that the invention extends to this modification of the circuit described above.

This description has been byway of example of how the invention can be carried out. Those of ordinary skill in the art will recognize that various details may be modified in arriving at other detailed embodiments, and that many of these embodiments will come within the scope of the invention.

Therefore, to apprise the public of the scope of the invention and the embodiments covered by the invention, the following claims are made.

We claim:

1. A method of connecting a communication node to an electrical communication network, the communication node having a node impedance and the network having a characteristic impedance, comprising the steps of:

(a) inserting a transformer having a center tap in series into the network;

(b) connecting the communication node to the center tap of the transformer via a drop line having a line impedance;

(c) shunting the transformer with the dual of a connection impedance formed of the sum of the line impedance and the node impedance;

wherein the connection impedance may be represented as discrete inductors and capacitors; and wherein the dual of the connection impedance is substantially formed by replacing series elements in the discrete representation of the connection impedance with parallel elements, inductors of the discrete representation of the connection impedance with capacitors, capacitors of the discrete representation of the connection impedance with inductors; and wherein each capacitance of the discrete representation of the connection impedance is multiplied by the square of the characteristic impedance to determine corresponding inductance of the dual and each inductance of the discrete representation of the connection impedance is divided by the square of the characteristic impedance to calculate the corresponding capacitance.

2. The method of claim 1 wherein the winding capacitance of the transformer form part of the capacitance of the dual.

3. A method of connecting a communication node to an electrical communication network, the communication node having a node impedance and the network having a characteristic impedance, comprising the steps of:

(a) inserting a transformer having a center tap and having a leakage inductance in series into the network;

(b) connecting the communication node to the center tap of the transformer via a drop line having a line impedance;

(c) shunting the transformer with the dual of a connection impedance formed of the sum of the line impedance and the node impedance and the leakage inductance;

wherein the connection impedance may be represented as discrete inductors and capacitors; and wherein the dual of the connection impedance is substantially formed by replacing series elements in the discrete representation of the connection impedance with parallel elements, inductors of the discrete representation of the connection impedance with capacitors, capacitors of the discrete representation of the connection impedance with inductors; and wherein each capacitance of the discrete representation of the connection impedance is multiplied by the square of the characteristic impedance to determine corresponding inductance of the dual and each inductance of the discrete representation of the connection impedance is divided by the square of the characteristic impedance to calculate the corresponding capacitance.

4. The method of claim 3 wherein the winding capacitance of the transformer form part of the capacitance of the dual.

5. A tap for connecting a communication node having a node impedance to an electrical communication network having a characteristic impedance comprising:

a center tap transformer having a first and second end to be attached in series with the network and having a center tap;

a drop line having a line impedance attached to the center tap of the transformer for connecting the center tap to the communication node; and a dual of the line and node impedance shunting the transformer;

wherein the line and node impedance may be represented as discrete inductors and capacitors; and wherein the dual of the impedance is substantially formed by replacing series elements in the discrete representation of the line and node impedance with parallel elements, inductors of the discrete representation of the line and node impedance with capacitors, capacitors of the discrete representation of the line and node impedance with inductors; and wherein each capacitance of the discrete representation of the line and node impedance is multiplied by the square of the characteristic impedance to determine corresponding inductance of the dual and each inductance of the discrete representation of the line and node impedance is divided by the square of the characteristic impedance to calculate the corresponding capacitance.

6. The method of claim 3 wherein the winding capacitance of the transformer form part of the capacitance of the dual.

* * * * *